United States Patent [19]

Dickens

[11] 3,842,359

[45] Oct. 15, 1974

[54] BALANCED PARAMETRIC AMPLIFIER

[75] Inventor: Lawrence E. Dickens, Baltimore, Md.

[73] Assignee: Westinghouse Electric Corporation, Pittsburgh, Pa.

[22] Filed: Nov. 30, 1973

[21] Appl. No.: 420,481

[52] U.S. Cl. ...................... 330/4.9, 330/53, 330/56, 333/21 A, 333/82 B, 333/84 M

[51] Int. Cl. .............................................. H03f 7/04

[58] Field of Search ...................................... 330/4.9

[56] References Cited

UNITED STATES PATENTS 3,596,197 7/1971 Chorney ............................ 330/4.9

*Primary Examiner*—John Kominski
*Assistant Examiner*—Darwin R. Hostetter
*Attorney, Agent, or Firm*—D. Schron

[57] ABSTRACT

A balanced parametric amplifier fabricated on a dielectric substrate located in a section of rectangular waveguide including a waveguide to stripline transition and having a pair of Schottky varactor diodes located at the junction of a suspended substrate stripline transmission line forming the signal circuit and a dielectrically loaded balanced parallel strip transmission line forming the pump circuit which also includes the waveguide to stripline transition. Each of the transmission lines is comprised of parallel metal strips of like configuration formed on a common dielectric substrate, one strip on each of the opposing broad surfaces of the substrate, with a Schottky varactor diode mounted on each of the broad surfaces at the junction of the suspended substrate stripline and the parallel strip transmission lines. Inductive posts on either side of the varactor diodes also run through the common dielectric substrate to the conductive strip on each of the opposing broad surfaces to form an idler circuit to restrict the idler circuit current to the vicinity of the varactor diodes.

11 Claims, 8 Drawing Figures

BALANCED PARAMETRIC AMPLIFIER

BACKGROUND OF THE INVENTION

1. Field of the Invention

The present invention pertains generally to parametric amplifiers for microwave frequency signals and more particularly to a balanced parametric amplifier including a pair of Schottky varactor diodes arranged in integrated circuit form for satisfying the idler circuit resonance requirements with a low loaded Q while maintaining reasonable decoupling through the external pump circuitry. Efficient coupling of the input signal energy to the pair of varactor diodes is obtained such that when the diodes are pumped at the proper frequency amplification of the input signal will result over a broad range of frequencies about a center signal frequency while minimizing noise from being added to the signal as a result of the amplification process.

Accordingly, the present invention is directed to a parametric amplifier with improved signal and pump coupling means whereby the bias and signal energies are supplied to the varactor diodes and whereby the pump and idler circuits are also coupled to the diodes in such a manner that high isolation between the signal circuit, the pump circuit and the idler circuit is maintained.

2. Description of the Prior Art

Parametric amplifiers of various types are well known to those skilled in the art and have heretofore been used for example to obtain low noise amplification of microwave signals. As is well known, the relationship between the frequency of the input signal wave to be amplified $f_s$, the frequency of the pump signal source $f_p$ and the idler frequency $f_i$ is expressed by the equation $f_p = f_s + f_i$. Such apparatus additionally generally utilizes a variable capacitance e.g., a varactor diode which is varied or modulated by a pump signal and to which the input signal to be amplified is applied. The frequencies of the pump signal and the input signal are such that the frequency of the pump signal is generally much higher than that of the input signal frequencies. As such, when the input signal is applied, the amplifier develops a difference frequency between the pump and signal frequencies commonly referred to as the idler frequency. A negative input impedance is presented to the input signal whereupon a reflected signal having an amplitude greater than the input signal is provided as an output. Such amplifiers are also known to have a common input and output terminal. In such configurations, however, a microwave circulator is required to receive the input signal at one port and transfer the output signal to another port. A typical example of this type of parametric amplifier is disclosed in U.S. Pat. No. 3,596,197 issued to P. Chorney.

Other prior art references that are worthy of note include:

3,051,844 - Beam, et al.
3,343,069 - Tsuda
3,375,454 - Aitchison
3,378,690 - Dodson
3,391,346 - Uhlir
3,513,403 - Chang
3,678,395 - Hunton, et al.
3,710,268 - Neuf Parametric amplifiers additionally utilize ceramically encased or packaged varactor diodes having both a series self resonance and a parallel self resonance, both of which are determined primarily by package parasitic reactances. The parasitic reactances, however, of the conventional varactor package are not easily controlled, thus making control of the required resonance relatively difficult, particularly where such devices are mass produced. Additionally, there is also a continuing need for improvements in such devices which can result in better electrical performance, improved reliability, and lower production costs.

SUMMARY

Briefly, the subject invention comprises two varactor diodes, preferably beam leaded diodes, located at the junction of a suspended substrate stripline transmission line forming the signal circuit and a dielectrically loaded balanced parallel strip transmission line configured forming the pump circuit with means on either sides of the diodes in the two transmission lines for producing idler circuit means restricting the idler energy to the vicinity of the diodes. The transmission lines are contained in a section of rectangular waveguide and pump power is coupled to the varactor diodes by means of a waveguide to parallel strip transmission line transition. The suspended substrate stripline and the dielectrically loaded parallel strip transmission line are coextensive and share a common substrate while being located within a waveguide cavity whose inner walls form the metallic conducting ground plane for the suspended substrate stripline. The dielectric substrate provides the support with a minimum of dielectric loading for the suspended substrate stripline while providing the dielectric matter for the dielectrically loaded parallel strip transmission line. Both transmission lines include two identical parallel conducting film elements formed on the dielectric substrate with one strip on each of the opposing broad surfaces and so disposed so as to obtain maximum coupling between the two lines.

DESCRIPTION OF THE PREFERRED EMBODIMENTS

Figure 1:
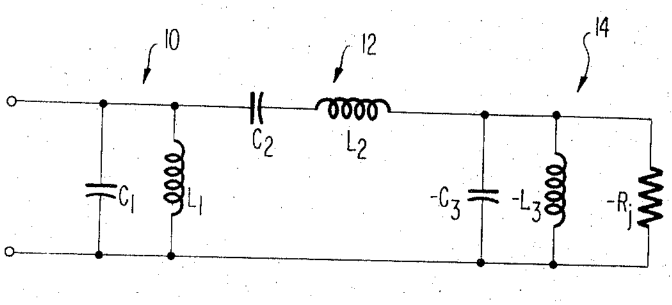
FIG. 1 is an electrical equivalent circuit diagram of the parametric amplifier according to the subject invention.

The present invention is directed to a parametric amplifier having a single tuned idler circuit and a double tuned signal circuit, the equivalent circuit of which is shown in FIG. 1. The circuit is referred to as being double tuned because there are two resonant networks involved and respectively comprised of the parallel combination 10 of the capacitance $C_1$ and inductance $L_1$ and the series combination 12 of the capacitance $C_2$ and $L_2$. The parallel combination of $C_1$ and $L_1$ represents the broadbanding matching network of the external input signal source coupled to the amplifier whereas the series combination of $C_2$ and $L_2$ represent the combined effect of the signal transmission lines and tuning capacitance provided by the varactor diodes. The idler circuit is represented by the network 14 comprised of the parallel configuration of $-C_3$, $-L_3$ and $-R_J$. Under some conditions a triple tuned response can be obtained.

Figure 2:
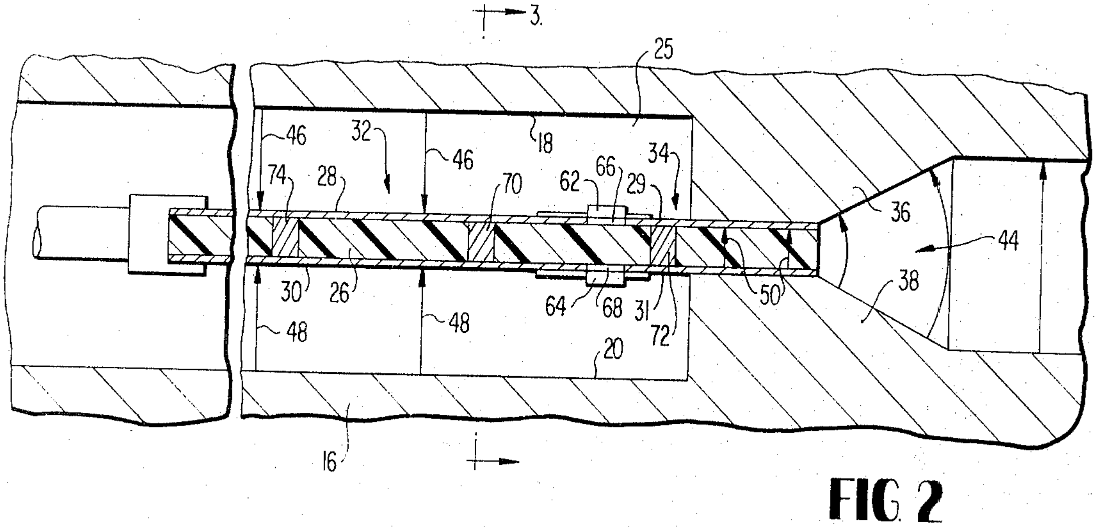
FIG. 2 is a sectional view taken along the longitudinal axis of a first embodiment of the subject invention.
Figure 3:
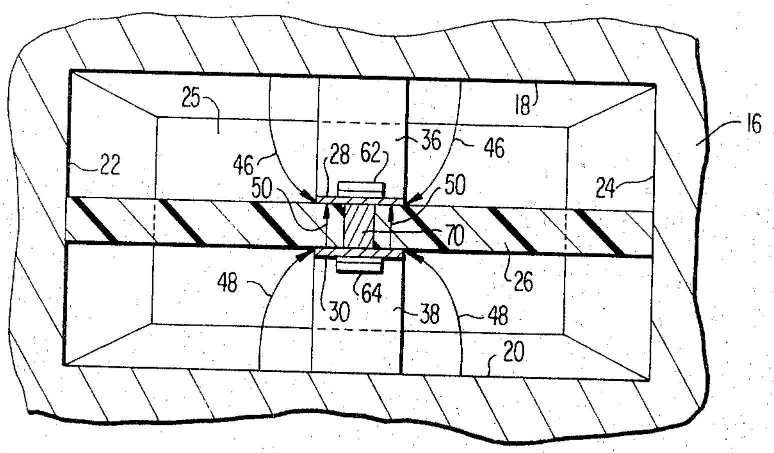
FIG. 3 is a transverse cross sectional view taken across the lines 3—3 of the embodiment shown in FIG. 2.

Referring now to the preferred embodiments of the subject invention, attention is first directed to FIGS. 2 and 3 wherein reference numeral 16 refers to a section of rectangular waveguide having an inner conducting surface comprised of a pair of broad walls 18 and 20 and a pair of narrow walls 22 and 24 forming a cavity 25. The parametric amplifier formed within the cavity section 25 is fabricated on a single substrate 26 of insulating (dielectric) material extending between and supported by the narrow side walls 22 and 24. Two strips 28 and 30 of metallized conducting film are respectively deposited in planar configuration on the broad surfaces of the substrate to form a suspended substrate stripline transmission line 32 in combination with a ground plane comprised of the broad walls 18 and 20 of the waveguide section 16. A second pair of conducting strips 29 and 31 fabricated on the substrate 26 and separated from the respective adjacent strips 28 and 30 form a loaded parallel strip transmission line 34 which contacts the relatively narrow ground plane portions 36 and 38 of a sloping waveguide to stripline transition section 44.

The even mode of electric field distribution by definition exists when the electric field is such that equal currents flow in the same direction in the lines 28 and 30. Accordingly electric field vectors 46 and 48 as shown in FIGS. 2 and 3 respectively exist between the conductive strip 28 and the upper broad wall surface 18 of the conductive strip 30 and the lower broad wall surface 20. Since no field is generated within the dielectric substrate 26, the losses can be kept very low. The field configuration for the even mode is very similar to the field configuration of air dielectric stripline or slab line. Thus the even mode or suspended substrate stripline transmission line as it is hereinafter referred to, is adapted to be coupled to a very low loss slab line signal circulator, not shown. The circulator is adapted to couple an input signal to the parametric amplifier and receive the amplified output signal therefrom via a common path, i.e., the suspended substrate stripline transmission line 32 and which accordingly acts as the signal circuit.

The odd mode of electric field distribution by definition exists when the electric field is such that equal but oppositely directed currents flow in the lines for example the conducting strips, 29 and 31. As such, electric field vectors 50 exist within the substrate 26 between the conductors 29 and 31. Thus the energy is contained essentially within the dielectric of the substrate 26, the concentration of which is determined by the dielectric constant of the substrate. The field configuration for the odd mode is very similar to the field configuration of a parallel plate transmission line. Thus the odd mode transmission line is called the dielectrically loaded parallel strip transmission line.

Figure 4:
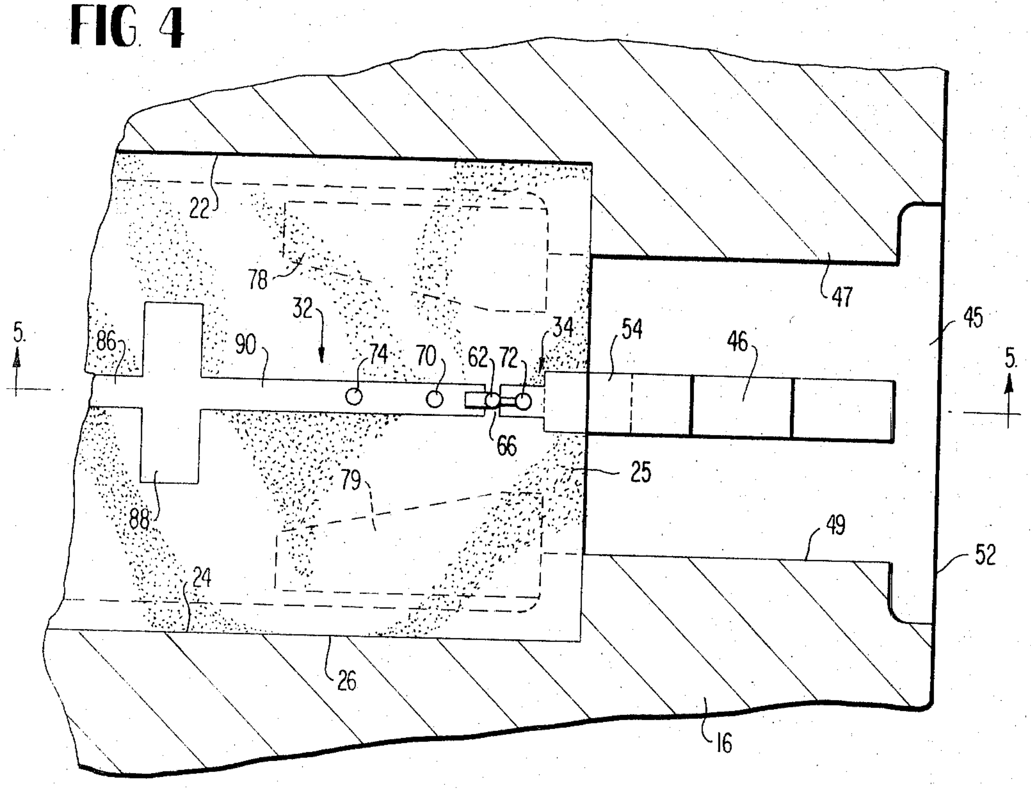
FIG. 4 is a partial planar view in section of a second embodiment of the invention including ridged waveguide transition.
Figure 5:
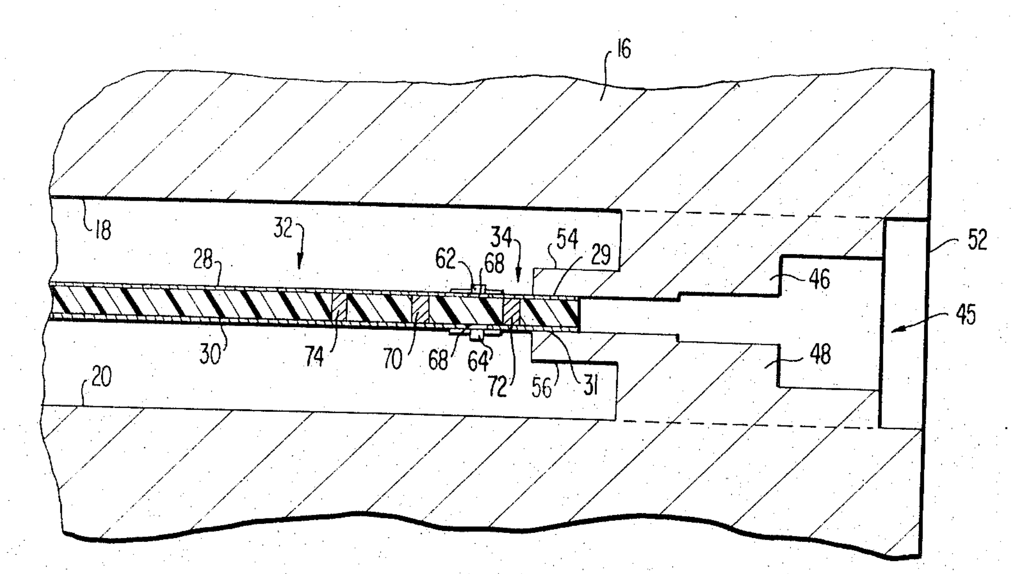
FIG. 5 is a sectional view taken along the longitudinal axis of the embodiment shown in FIG. 4.
Figures 6, 7:
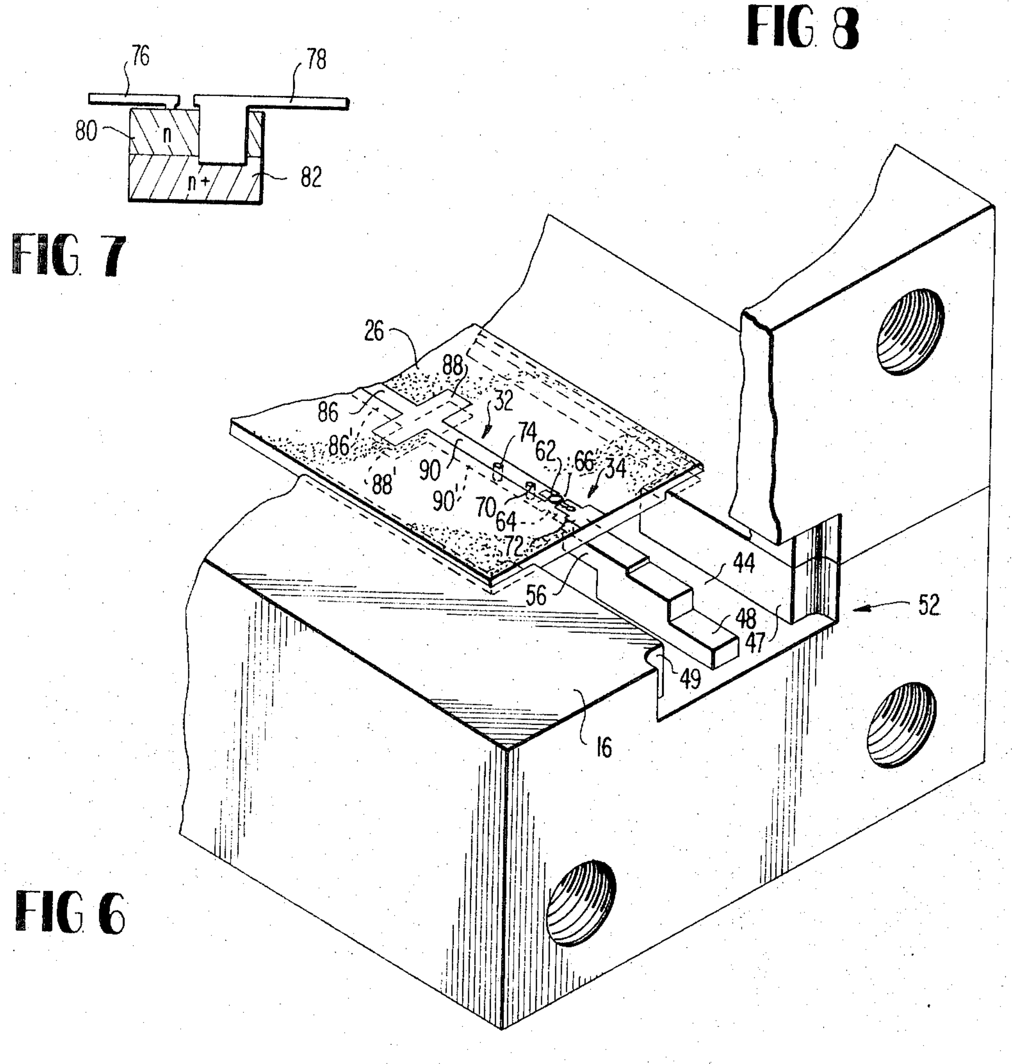
FIG. 6 is a perspective view partially in section of the embodiment shown in FIGS. 4 and 5.
FIG. 7 is a cross sectional view of a beam leaded Schottky varactor diode utilized in connection with the subject invention.

As the field configuration for the odd mode is very similar to the field configuration found between the ridges of a ridged waveguide, a natural transition from the $TE_{10}$ mode in rectangular waveguide to the TEM mode in the parallel strip transmission line can be provided by a stepped or tapered section of ridged waveguide. To this end the second embodiment of the invention as shown in FIGS. 4, 5 and 6 utilizes a ridged waveguide transition section 45 including symmetrically disposed ridge elements 46 and 48 having three discrete steps tapering down from an input port 52 to finger type extensions 54 and 56 which joins with the circuitry 34. A pump frequency source, not shown, supplies pump energy to the port 52 and accordingly, the microwave to stripline transition 45 together with the parallel strip transmission line 34 forms the pump circuit for the parametric amplifier. The pump energy is supplied via the standard dimension rectangular waveguide port 52 to the ridged waveguide section 44 which in addition to the ridged elements 46 and 48 include narrowed side walls 47 and 49. The stepping of ridge members in the height dimension is such that coupling of the pump wave energy to the dielectrically loaded parallel strip transmission line 34 is obtained. The inner most or final section 54 and 56 of the stepped ridge elements 46 and 48 allow structural flexibility in the substrate support function and thereby minimize the danger of substrate breakage. It should also be pointed out that the ridge members 46 and 48 do not extend across to the side walls 47 and 49 but are relatively narrow elements in the width dimension. The distance between the side walls 47 and 49 of the ridged waveguide section 44 is selected so as to hold the waveguide section beyond cutoff thereby insuring retainment of the idler currents in the immediate vicinity of the varactor diodes 62 and 64.

In each of the embodiments, a pair of beam leaded varactor diodes 62 and 64 are respectively located on one side of the substrate 26 such that the diode 62 is connected across the gap 66 existing between the conductors 28 and 29 while diode 64 is placed in the gap 68 existing between the conductors 30 and 31. The diodes 62 and 64 are bonded in place to the respective conductors and a ground return is provided by the conductors 29 and 31 respectively being in electrical contact with the microwave transition elements 36 and 38 as shown in FIG. 2 or elements 46 and 48 as shown in FIG. 5. The diodes 62 and 64 being respectively coupled to the conductors 28 and 30 are driven by an input signal wave in parallel configuration; however, the diodes are connected in such a manner that the pump signal applied to the port 45 which excites the odd mode, drives the diodes 62 and 64 in a series connection.

Referring now to FIG. 7 there is disclosed a cross sectional view illustrative of a beam leaded Schottky varactor diode. Such a device includes a pair of beam leads 76 and 78 contacting a semiconductor body comprised of an epitaxial layer 80 of semiconductor material such as gallium arsenide having *n* type semiconductivity contiguous with a layer 82 of gallium arsenide having n+ semiconductivity. The beam lead 76 projects to the surface of the layer 80 while the beam lead 78 projects through the *n* type layer 80 and into the *n*+ type layer 82.

A pair of inductive posts elements 70 and 72 are formed of metallization in the substrate 26 on either side of the diodes 62 and 64, respectively, having electrical connections between the conductors 28 and 30 and 29 and 31 which forms an idler circuit for the circulating idler current existing between the diodes. The post 72 is also disposed relative to the varactor diodes 62 and 64 so as to aid in matching the pump energy into the diodes. A third inductive post 74 is formed in the substrate between the conductors 28 and 30 behind the post 70 to isolate the idler circuit from the signal circuit.

Additionally, when desirable, resistive load elements 78 and 79 comprising microwave absorbant material and shown in phantom view in FIG. 4 may be included. The elements 78 and 79 are sufficiently removed from the suspended substrate stripline conductors 28 and 30 so that they represent no loss of signal wave energy; however, they are positioned adjacent the ridged waveguide transition elements 46 and 48 so as to attenuate any pump energy which might couple into the waveguide cavity 25 bonded by the waveguide surfaces 18, 20, 22 and 24.

Figure 8:
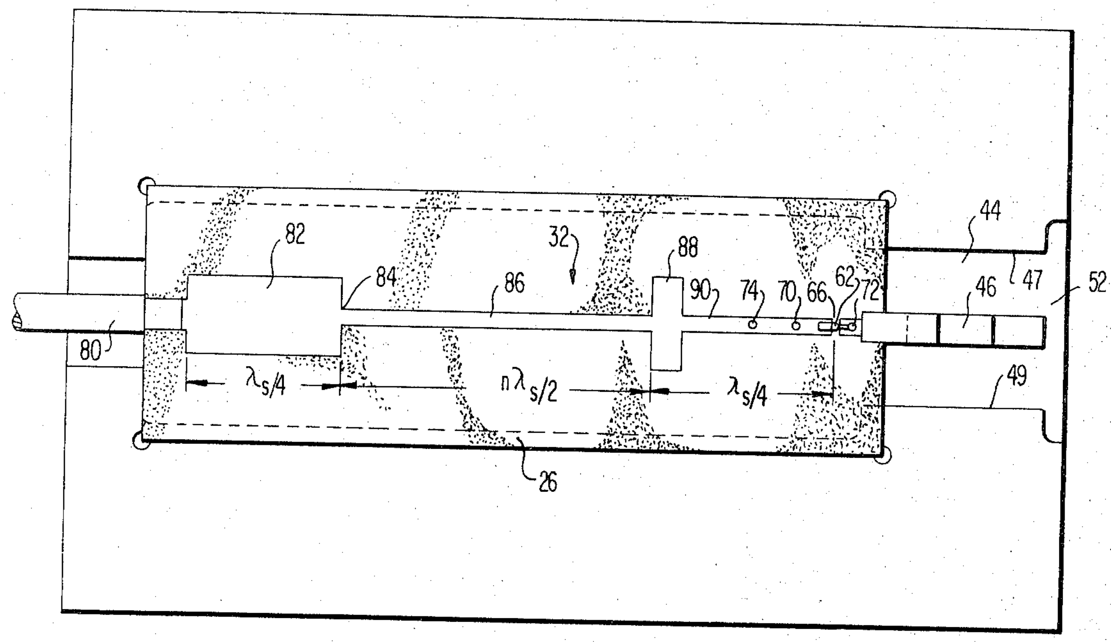
FIG. 8 is a complete plan view of the stripline circuitry included in both the signal and pump circuits.

Referring now to FIG. 8 and the circuit configuration of the suspended substrate stripline transmission line 32 forming the signal circuit, the input signal is applied via transmission line 80 having for example a 50 ohm impedance. The conductors 28 and 30 illustrated for example in FIGS. 2 and 5, are configured in a first section 82 having a length substantially equal to one quarter wavelength $\lambda_s/4$ of the signal frequency and has a predetermined selected width. The section 82 transforms the impedance level of the 50 ohm line 80 to a relatively lower level at the junction 84 which connects to a relatively narrower width section 86 having a length in the order of a selected multiple of one half wavelengths $n\lambda_s/2$ of the input signal frequency and acts as a resonant cavity tuned to the signal frequency. At the end of the section 86 is a relatively short section 88 having a width substantially equal to the width of the first section 82. The section 88 comprises a capacitive tab which also is required for signal reactive tuning. Next a quarter wavelength $\lambda_s/4$ section 90 extends from the capacitive tab section 88 to the varactor diodes 62 and 64. The quarter wavelength section 90 acts as an impedance inverter to transform the series varactor diode impedance which consists of a low resistance and a high capacitive reactance to an admittance at the capacitive tab section 88 at which point the transformed varactor diode impedance appears as a relatively high shunt resistance parallel with the relatively low value of shunt inductive reactance. The shunt inductive reactance, however, is tuned out by the capacitive effect of the capacitive tab section 88.

In operation, the RF input signal to be amplified is applied by way of the suspended substrate stripline transmission circuit 32 including the sections 82, 86, 88 and 90 formed in both conductive film conductors 28 and 30, respectively, to the varactor diodes 62 and 64. The pump power is supplied by way of the port 52 in the waveguide 16 to the dielectrically loaded parallel plate transmission line 34 by way of the ridged waveguide transition 44 and producing a field therein which causes a flow of electric charge within the varactor diodes 62 and 64 at the frequency of the pump energy. The interaction of the signal wave current and the pump wave current coupled with the voltage dependent capacitive characteristic of the varactor diodes 62 and 64 causes the varactor diodes to exhibit a negative resistance to the signal wave, resulting in an amplified version of an incident signal wave being reflected to the transmission line 80. A circulator, not shown, coupled to the transmission line 80 is adapted to couple the incident input signal to the amplifier and thereafter receiving the amplified reflected signal wave for translation to a utilization circuit in a manner well known to those skilled in the art. The two configurations disclosed herein provide a balanced configuration of the varactor diodes 62 and 64 which minimizes the transmission of pump or idler energy into the RF signal circuit including the suspended substrate stripline transmission line circuitry 32.

Thus what has been shown and described is a microwave structure characterized by low signal circuit loss, high reproducability and low production costs, and including highly reproducable batch fabricated beam leaded varactor diodes and photolithographically reproduced thin film microwave circuitry on low cost dielectric substrates.

I claim as my invention:

1. A parametric amplifier including a signal circuit, a pump circuit, and an idler circuit with varactor diode means located at the junction of the signal circuit and the pump circuit, comprising in combination:

a section of microwave waveguide having a cavity;

said pump circuit supplying pump energy from an external source to one end of said section of waveguide and including, dielectrically loaded parallel strip transmission line means terminating at one end in said waveguide cavity, a waveguide to parallel strip transmission line transition coupling the other end of said parallel strip transmission line means to said external pump source, said parallel strip transmission line terminating in said transition, and first inductive reactance means selectively positioned with respect to said varactor diode means in said parallel strip transmission line means for matching said varactor diode means to the pump energy;

said signal circuit commonly coupling a signal from an external signal circuit to and from the other end of said section of waveguide and including, suspended substrate stripline transmission line means located in said waveguide cavity for transforming the impedance of the external signal circuit and the varactor diode means to a common point of relatively low impedance and for obtaining a double tuned gain-bandpass characteristic, said suspended substrate stripline transmission line means comprising, a first stripline portion of selected geometry for reducing the magnitude of the external load resistance provided by said external signal circuit to a predetermined magnitude, a second stripline portion of selected geometry adjacent said first stripline portion and acting as a resonant circuit tuned to the frequency of said signal coupled to said signal circuit, a third stripline portion coupled to said first and second stripline portions, being of selected geometry and acting as a relatively low reactance section that parallely resonates with the reactance of the varactor diode means and forming said common point of relatively low impedance thereby, and a fourth stripline portion of selective geometry adjacent said third stripline portion and acting as an impedance inverter of the reactance of the reactor diode means to said common point of relatively low impedance;

said varactor diode means being coupled between said fourth stripline portion and the other end of said dielectrically loaded parallel strip transmission line means and located in a gap therebetween; and said idler circuit circulating an idler current and including said first inductive reactance means, second inductive reactance means selectively positioned with respect to said varactor diode means in said fourth stripline portion, and the parallel strip and suspended substrate stripline transmission line means segments lying between said first and second inductive reactance means on either side of said varactor diode means.

2. The parametric amplifier as defined by claim 1 wherein said section of waveguide comprises rectangular waveguide.

3. The parametric amplifier as defined by claim 2 wherein said dielectrically loaded parallel strip transmission line means and said suspended substrate stripline transmission line means each comprises a dielectric substrate and an electrically conductive film on both sides of said substrate with the conductive film pattern on one side of said substrate being a mirror image of the conductor pattern on the other side.

4. The parametric amplifier as defined by claim 3 wherein said dielectrically loaded parallel strip transmission line means and said suspended substrate stripline transmission line means share a common substrate.

5. The parametric amplifier as defined by claim 4 wherein said varactor diode means comprises a pair of Schottky barrier diodes with one diode being mounted on each side of said substrate between respective parallel strip and suspended substrate stripline transmission line portions.

6. The parametric amplifier as defined by claim 5 wherein said pair of Schottky barrier diodes are comprised of beam leaded diodes.

7. The parametric amplifier as defined by claim 1 wherein said first and second inductive reactance means are comprised of electrically conductive posts connecting the conductive film on both sides of said substrate.

8. The parametric amplifier as defined by claim 1 wherein said first stripline portion has a generally rectangular configuration of predetermined width and having a length in the order of one quarter wavelength of the signal frequency, said second stripline portion has a generally rectangular configuration of a length of selected multiples of one half wavelengths of said signal frequency and having a width relatively narrower than the width dimension of said first stripline portion, said third stripline portion has generally rectangular configuration and having a width substantially equal to the width of said first stripline portion and of a length substantially narrower than a quarter wavelength of said signal frequency, and wherein said fourth stripline portion has a generally rectangular configuration and having a length in the order of a quarter wavelength of said signal frequency and a width substantially equal to the width of said second line portion.

9. The parametric amplifier as defined by claim 8 and additionally including microwave energy absorbing material located in said waveguide section adjacent said waveguide to parallel strip transmission line transition for absorbing selected portions of said pump energy.

10. The parametric amplifier as defined by claim 1 wherein said waveguide cavity includes a pair of mutually parallel broad and narrow walls and wherein said common substrate is mounted in said narrow walls of said waveguide.

11. The parametric amplifier as defined by claim 10 wherein said transition comprises a ridged waveguide section including a pair of broad walls, a pair of narrow wall portions having a mutual separation less than the narrow walls of said section of waveguide, and a pair of opposed relatively narrow width stepped conductive elements mounted on said broad walls, said elements having a stepped mutual separation decreasing toward said dielectrically loaded parallel strip transmission line means.

* * * * *